United States Patent
Kabrell et al.

(10) Patent No.: US 6,481,491 B2
(45) Date of Patent: *Nov. 19, 2002

(54) COOLING APPARATUS BASED ON HEAT ENERGY BOUND TO WORKING FLUID IN PHASE TRANSITION

(75) Inventors: Carl Kabrell; Reijo Lehtiniemi, both of Helsinki; Jukka Rantala, Espoo; Timo Heikkilä, Oulu, all of (FI); Tapio Tuamainen, deceased, late of Virkkala (FI), by Raija Kyllikki Tuomainen, Kimmo Veli Tapio Tuomainen, Kari-Pekka Mikael Tuomainen, legal representatives

(73) Assignee: Nokia Telecommunications Oy, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/380,481

(22) PCT Filed: Mar. 3, 1998

(86) PCT No.: PCT/FI98/00188

§ 371 (c)(1), (2), (4) Date: Nov. 22, 1999

(87) PCT Pub. No.: WO98/39955

PCT Pub. Date: Sep. 11, 1999

(65) Prior Publication Data

US 2001/0003305 A1 Jun. 14, 2001

(30) Foreign Application Priority Data

Mar. 4, 1997 (FI) .................................................. 970916
Feb. 27, 1998 (FI) .................................................. 980454

(51) Int. Cl.[7] .................................................. F28F 7/00
(52) U.S. Cl. .............................. 165/80.3; 165/104.33; 165/104.14; 165/185; 361/700; 257/715; 174/15.2
(58) Field of Search .......................... 165/80.3, 104.33, 165/104.21, 185, 104.14, 104.26; 361/700; 257/715; 174/15.2

(56) References Cited

U.S. PATENT DOCUMENTS

| 5,213,153 | A | * | 5/1993 | Itoh .................. 165/104.33 |
| 5,253,702 | A | * | 10/1993 | Davidson et al. ... 165/104.33 X |
| 5,355,942 | A | | 10/1994 | Conte |
| 5,381,859 | A | * | 1/1995 | Minakomi et al. ......... 165/80.3 |
| 5,527,588 | A | | 6/1996 | Camarda et al. |
| 5,535,816 | A | * | 7/1996 | Ishida .................. 165/104.33 |
| 5,689,404 | A | * | 11/1997 | Katsui .................. 165/80.3 X |
| 5,699,853 | A | * | 12/1997 | Goth et al. ......... 165/104.33 X |
| 5,720,339 | A | * | 2/1998 | Glass et al. ............ 165/104.26 |
| 5,740,014 | A | * | 4/1998 | Lin .................. 165/80.3 X |
| 5,793,611 | A | * | 8/1998 | Nakazato et al. ... 165/104.33 X |
| 5,819,402 | A | * | 10/1998 | Edwards et al. ....... 165/80.3 X |

FOREIGN PATENT DOCUMENTS

| EP | 753 713 | | 1/1997 | |
| JP | 2-110296 | | 4/1990 | |
| JP | 404225791 | * | 8/1992 | ............ 165/104.33 |

* cited by examiner

Primary Examiner—Christopher Atkinson
(74) Attorney, Agent, or Firm—Pillsbury Winthrop LLP

(57) ABSTRACT

The invention relates to a device for removing heat from an electronic component mounted on a circuit board. The device uses a working fluid circulated through cooling elements which are integrated into a metal matrix composite structure. The cooling elements are positioned and arranged within the structure to efficiently manage heat dissipation by evacuating the heat from the component in a multi-directional manner.

3 Claims, 2 Drawing Sheets

COOLING APPARATUS BASED ON HEAT ENERGY BOUND TO WORKING FLUID IN PHASE TRANSITION

BACKGROUND OF THE INVENTION

1. Field of the Invention

The invention relates to a cooling apparatus based on the principle of using a working liquid to remove heat energy.

The need for cooling electronic components is an old and known problem, the significance of which is becoming more pronounced with increasing power and integration densities, since all electronic components generate heat, which has to be dissipated to accomplish an optimal and reliable operation of the components. As the field of electronics continuously progress in a direction where increasingly high powers are processed in increasingly small volumes, the dissipation of heat from components has become a decisive planning criterion. Many current electronic appliances need a cooling capacity that cannot be achieved by conventional metallic cooling fins.

2. Description of Related Art

New methods, such as heat pipes, have recently emerged along with conventional convection cooling. A heat pipe transfers heat very efficiently; its effective thermal conductivity is of the order of 1000 times that of copper. A heat pipe transfers heat from one end to the other as latent heat of phase transition, i.e. a liquid boils and evaporates in the hot end (an evaporator) of the pipe, and the created pressure difference makes the vapour move to the other, cold end (a condenser) of the pipe, where the vapour emits its latent heat and returns as a liquid to the evaporator, driven, for example, by capillary force. Heat pipes have been commercially available since 1960's. Basically they can respond to the heating needs of electronics, but the industry has only recently begun to regard heat pipes as a reliable and advantageous solution for the cooling problems of the most demanding electronics applications.

Until now, heat pipes have generally transferred heat directly from a hot component to the cooling apparatus by each component having a separate heat pipe. It is extremely difficult, space-consuming and clumsy to place the heat pipes efficiently using this principal, particularly if there are several components requiring cooling on the same circuit board. In prior art solutions the heat pipes are generally either at the circuit board level, in which case the condensers of the pipes are cooled by heat sinks or the like on the sides of the board, or vertically against the circuit boards, in which case the heat sink is parallel to the circuit board.

U.S. Pat. No. 5,527,588 presents a cooling apparatus for cooling a heat source using heat energy bound to working fluid in phase transition. The cooling apparatus comprises a plurality of elongated cooling elements extending parallel in at least two levels so as to form a two-dimensional matrix of cooling elements. In addition, the cooling apparatus comprises a heat conducting material binding the cooling elements. In this cooling apparatus the cooling elements are used to transfer heat in two directions, parallel to the level of the cooling element matrix.

SUMMARY OF THE INVENTION

An object of the present invention is to provide a cooling apparatus for cooling electronic components which is superior to the ones used until now and by which the problems of placing heat pipes can be avoided. An exemplary embodiment of the invention provides a cooling apparatus comprising elongated cooling elements containing a working fluid. The elongated cooling elements extend in at least two different directions in order to form a matrix of cooling elements. The apparatus also comprises a heat conducting material configured for binding together the matrix of cooling elements.

The invention is based on multi-directional heat pipes integrated into a metal matrix composite structure.

The cooling apparatus of the invention is characterized in that the elongated cooling elements are arranged parallel to the circuit board level and in at least one direction deviating from the circuit board level.

The invention can significantly improve the cooling of thermally critical components and thus enable the implementation of more and more efficient electronic systems and/or reduce the costs caused by conventional cooling systems.

BRIEF DESCRIPTION OF THE DRAWINGS

In the following the invention will be described in greater detail by means of examples with reference to the accompanying drawings, in which.

DESCRIPTION OF THE PREFERRED EMBODIMENTS

Figure 1:
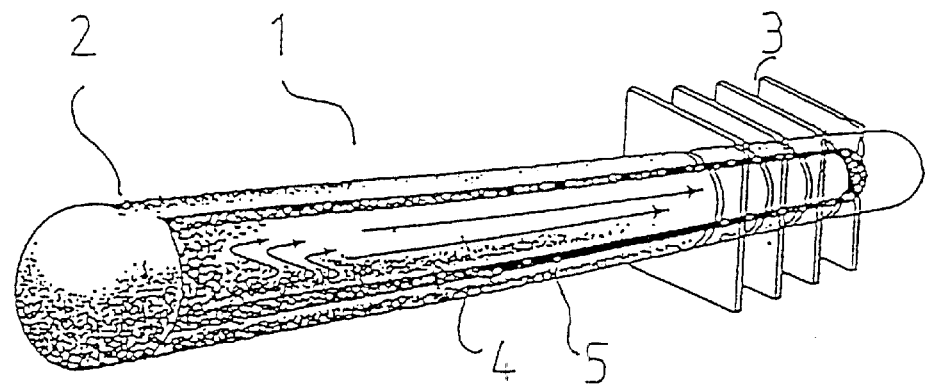
FIG. 1 shows a separate heat pipe and the structure thereof, FIG. 2 schematically shows a cooling apparatus of an embodiment of the invention.

FIG. 1 shows the structure and function of a heat pipe 1, known per se, to be used in the invention. The heat pipe is shown partly in cross section. The heat pipe, which is a gas tight tube-like air-evacuated cooling element, has two ends. The object to be cooled, or in this case an end 2 that is near a heat generating electronic circuit, is called an evaporator and an opposite end 3 is called a condenser. The heat pipe contains liquid working fluid which can be, for example, ammonia, water, acetone or methanol depending on the application. In the evaporator end 2 a liquid medium evaporates into gas and binds evaporation heat, or latent heat, characteristic of the medium to itself. Evaporation causes a pressure gradient in the pipe forcing the vapour to flow along a middle part 4 of the pipe towards the condenser 3. The vapour is adiabatically conveyed, whereby the variations in pressure and temperature are small. In the condenser the vapour condenses back into liquid, conveying the evaporation heat to the heat sinks of the condenser. The working fluid is returned in liquid form to the evaporator along a porous prime coat 5 forming the external thread of the heat pipe by capillary force. The basic function of a heat pipe is known in the prior art and will therefore not be explained here in greater detail.

Alternatively micro heat pipes can preferably be used in the cooling apparatus of the invention in which case the capillary force is caused by the geometry of the pipe. The basic function of a micro heat pipe is also known in the art and will not be described here in greater detail.

Figure 2:
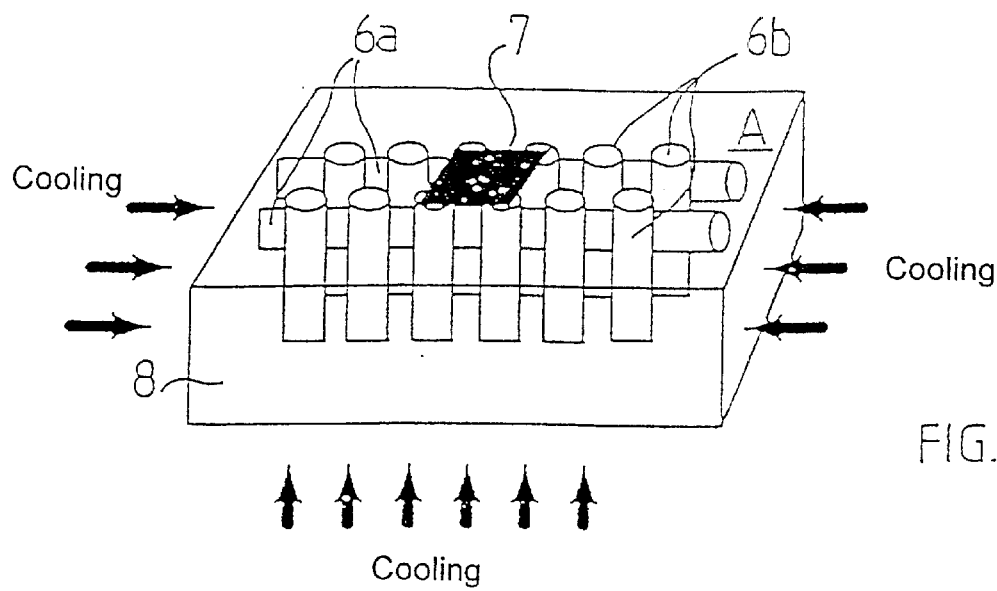

FIG. 2 shows an embodiment of the cooling apparatus based on working fluid in phase transition of the invention. In accordance with the invention the cooling apparatus is formed from a matrix of elongated cooling elements i.e. heat pipes. The circuit board level is marked with the letter A. In this example the heat pipes are two-dimensional; some 6a extending in parallel from a component 7 parallel to the circuit board level A, and others 6b vertically against the circuit board level. Corresponding main directions of the cooling effect are marked in the Figure. A heat conductive material 8, into which the heat pipes are embedded sees to it that heat emission from the component takes place at least to some extent in three dimensions. The heat simultaneously moves as efficiently as possible from the component to the heat pipe through the heat conductive material 8.

Deviating from the case in FIG. 2, the vertical heat pipes 6b can alternatively be at another angle, other than vertical to the circuit board level A. Alternatively the heat pipes 6a may be arranged to extend in various directions.

A suitable material for binding heat pipes is metal matrix composite preferably formed from silicon carbide (SiC) into which the heat pipes are placed and into which molten aluminum is brought for binding the structure and for making the appearance compact, using, for example, a conventional die casting method. The portion of silicon carbide can be, for example, 70% and the portion of aluminum 30% by weight. Also other materials such as silicon nitride, aluminum oxide etc. can be used but their heat conductivity is inferior to that of silicon carbide.

The circuit board may comprise one or several components requiring cooling. When the heat pipes have been integrated into a composite, the cooling apparatus according to the invention becomes a fixed structure which is easy to mount, space-saving, and durable. The invention can be utilized particularly in the cooling of power electronics, e.g. processors, ASIC circuits, power sources and the components of RF electronics.

Figure 3:
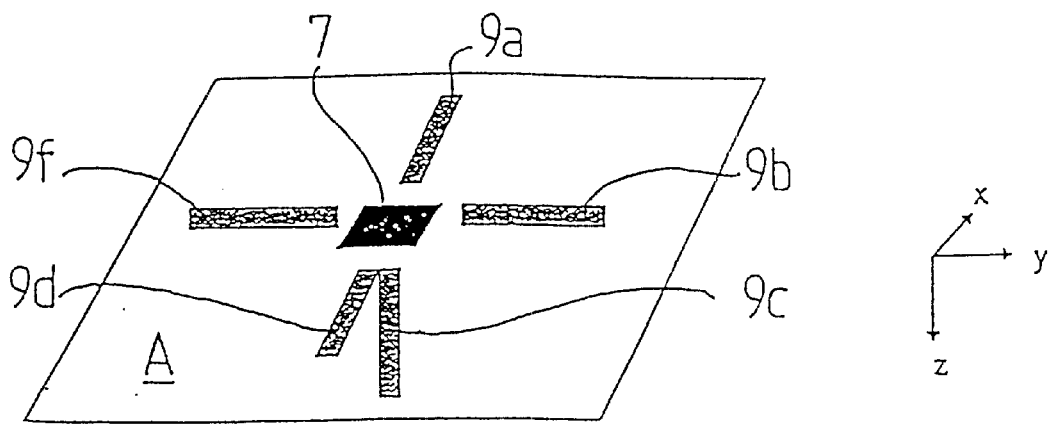
FIG. 3 shows the principal of a second embodiment of the invention.

According to the principal shown in FIG. 3 the heat pipes 9a–9f can also be arranged to form a three dimensional network around the component 7 to be cooled, in which case lost heat can be evenly divided into a cooling surface area as wide as possible. Thus, the cooling effect takes place mainly in all five directions shown by the heat pipes 9a–9f presented in rough outline in the Figure or in their desired subset according to the space and need of the heat pipes. The circuit board level is marked with the letter A.

In the case shown in FIG. 3 the cooling effect can be extended to take place in six directions if two cooling apparatuses according to FIG. 3 are used and the component to be cooled is placed between the two.

As a third alternative, the location of the heat pipes at the circuit board level vertically against each other so as the heat emission from the component takes place parallel to the circuit board level in two dimensions can be mentioned.

Figure 4:
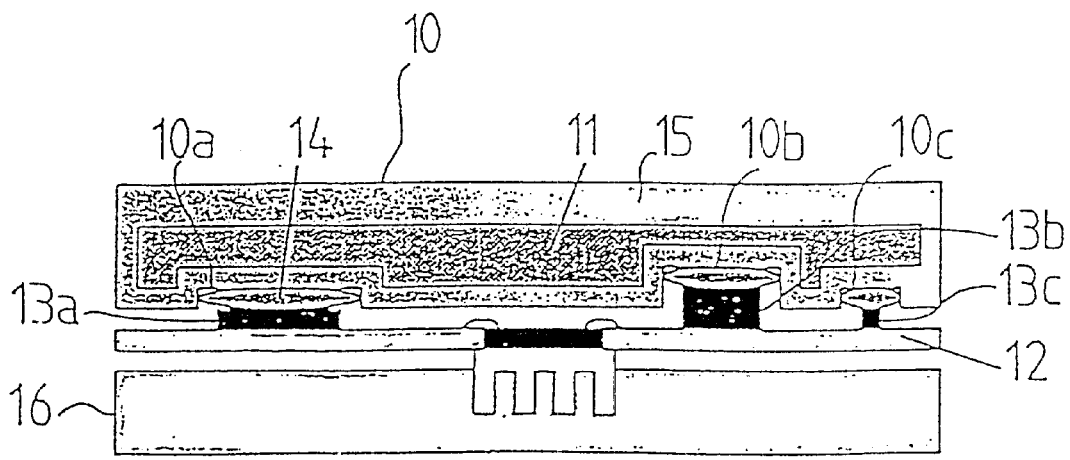
FIG. 4 is the cross section of a cooling apparatus of a third embodiment of the invention.

In the embodiment in FIG. 4 cavities 10a–10c corresponding with the topology of a circuit board 12 and components 13a, 13b, 13c therein are worked into the cooling apparatus 10. The cooling apparatus 10 is then preferably of the same size as the circuit board 12. Then the heat pipes 11 can be accurately imposed in the immediate vicinity of the hot components and the number and direction of the heat pipes can be varied according to what is most appropriate. By using very small so-called micro heat pipes, the heat pipes can be placed at desired locations of the cooling apparatus as areas of desired sizes, with no need to plan how to place individual pipes.

The heat pipes can be built to either transfer heat to external cooling fins 16 or only to balance the temperature distribution of the circuit board metal matrix combination 12, 15 by conveying heat from the hot components 13a, 13b, 13c to the other material. Cooling the actual circuit board 12 is in some cases also preferable since up to 70% of the lost heat of the components can vanish into it. In this case the circuit board can be used as a heat sink and its temperature distribution becomes homogeneous.

Such a worked structure can be formed to be very compact particularly if there are several components to be cooled on the circuit board in which case the cooling apparatus is easy to handle and install and the circuits are also easy to maintain. A thermal grease 14 or another medium is preferably placed between the components and the cooling apparatus to improve thermal contact between the components and the cooling apparatus.

It is obvious to one skilled in the art that the different embodiments of the invention are not restricted to the examples described above but can vary within the scope of the claims below.

What is claimed is:

1. A cooling apparatus including a circulating working fluid, the circulating working fluid transitioning in phase to dissipate heat generated by at least one electronic component inserted in a circuit board, the cooling apparatus comprising:

a plurality of elongated cooling elements configured to contain the circulating working fluid, the plurality of cooling elements forming a matrix of cooling elements; and a heat conducting material binding the matrix of the cooling elements, wherein (i) at least one of the elements of the plurality of elements is arranged to extend parallel to a plane formed by the circuit board, (ii) at least one of the elements of the plurality of elements is arranged to extend parallel to the plane formed by the circuit board but not parallel to the elements of (i), and (iii) at least one element of the plurality of elements extends in a direction not parallel to the plane formed by the circuit board.

2. The cooling apparatus of claim 1, further comprising a cavity formed on an exterior surface of the apparatus, the cavity facing the circuit board and substantially conforming to a shape of the at least one electronic component.

3. The cooling apparatus of claim 2, further comprising a medium configured to improve thermal contact is placed between the at least one component and the cooling apparatus.

\* \* \* \* \*

UNITED STATES PATENT AND TRADEMARK OFFICE
CERTIFICATE OF CORRECTION

PATENT NO.   : 6,481,491 B2
DATED        : November 19, 2002
INVENTOR(S)  : Kabrell et al.

It is certified that error appears in the above-identified patent and that said Letters Patent is hereby corrected as shown below:

Title page,
Item [75], Inventors, please change "Carl Kabrell; Reijo Lehtiniemi, both of "Helsinki; Jukka Rantala, Espoo; Timo Heikkilä, Oulu, all of (FI); Tapio Tuamainen, deceased, late of Virkkala (FI), by Raija Kyllikki Tuomainen, Kimmo Veli Tapio Tuomainen, Kari-Pekka Mikael Tuomainen, legal representatives" to
-- Carl Kabrell; Reijo Lehtiniemi, both of Helsinki; Jukka Rantala, Espoo; Timo Heikkilä, Oulu, all of (FI); Tapio Tuomainen, deceased, late of Virkkala (FI), by Raija Kyllikki Tuomainen, Kimmo Veli Tapio Tuomainen, Kari-Pekka Mikael Tuomainen, legal representatives --

Please change Item [87], "PCT Pub. Date: Sep. 11, 1999" to
-- PCT Pub. Date: Sep. 11, 1998 --

Signed and Sealed this

Third Day of June, 2003

JAMES E. ROGAN
*Director of the United States Patent and Trademark Office*